United States Patent
Abura et al.

(10) Patent No.: US 9,678,424 B2
(45) Date of Patent: *Jun. 13, 2017

(54) PHOTOSENSITIVE RESIN COMPOSITION AND PHOTOSENSITIVE RESIN PRINTING PLATE ORIGINAL

(71) Applicant: TORAY INDUSTRIES, INC., Tokyo (JP)

(72) Inventors: Tsutomu Abura, Okazaki (JP); Shuhei Yabuki, Okazaki (JP)

(73) Assignee: TORAY INDUSTRIES, INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/418,710

(22) PCT Filed: Jul. 30, 2013

(86) PCT No.: PCT/JP2013/070615
§ 371 (c)(1),
(2) Date: Jan. 30, 2015

(87) PCT Pub. No.: WO2014/021322
PCT Pub. Date: Feb. 6, 2014

(65) Prior Publication Data
US 2015/0205201 A1    Jul. 23, 2015

(30) Foreign Application Priority Data

Jul. 31, 2012 (JP) ................. 2012-169411
Jul. 31, 2012 (JP) ................. 2012-169412

(51) Int. Cl.
| | | |
|---|---|---|
| G03F 7/11 | (2006.01) | |
| G03F 7/031 | (2006.01) | |
| G03F 7/027 | (2006.01) | |
| G03F 7/037 | (2006.01) | |
| G03F 7/038 | (2006.01) | |
| G03F 7/32 | (2006.01) | |
| G03F 7/033 | (2006.01) | |

(52) U.S. Cl.
CPC .............. *G03F 7/031* (2013.01); *G03F 7/027* (2013.01); *G03F 7/033* (2013.01); *G03F 7/037* (2013.01); *G03F 7/0388* (2013.01); *G03F 7/322* (2013.01)

(58) Field of Classification Search
CPC ...................................... G03F 7/027
See application file for complete search history.

(56) References Cited

FOREIGN PATENT DOCUMENTS

| JP | 56-32138 A | 4/1981 |
|---|---|---|
| JP | 57-45535 A | 3/1982 |
| JP | 59-68734 A | 4/1984 |
| JP | 3-274558 A | 12/1991 |
| JP | 11-65115 A | 3/1999 |
| JP | 11065115 A * | 3/1999 |
| JP | 2004-294596 A | 10/2004 |
| JP | 2005-331811 A | 12/2005 |
| JP | 3796914 B2 * | 7/2006 |

OTHER PUBLICATIONS

International Search Report issued in PCT/JP2013/070615, mailed on Aug. 27, 2013.
International Preliminary Report on Patentability issued in PCT/JP2013/070615, mailed on Feb. 3, 2015.

* cited by examiner

Primary Examiner — Chanceity Robinson
(74) Attorney, Agent, or Firm — Birch, Stewart, Kolasch & Birch, LLP

(57) ABSTRACT

[Problem] To provide a photosensitive resin composition which exhibits excellent relief image reproducibility and improved toughness and printing durability, and a photosensitive resin printing plate precursor. [Solution] A photosensitive resin composition which is characterized by containing (A) a modified and partially saponified poly(vinyl acetate) having a reactive group in a side chain, (B) a polyamide having a basic nitrogen atom, (C) a compound having a molecular weight of 300 or lower, a 5-7 membered ring and a polymerizable ethylenic double bond, and (D) a photopolymerization initiator.

17 Claims, No Drawings

PHOTOSENSITIVE RESIN COMPOSITION AND PHOTOSENSITIVE RESIN PRINTING PLATE ORIGINAL

TECHNICAL FIELD

The present invention relates to a photosensitive resin composition and a photosensitive resin printing plate original using the same. More particularly, the present invention relates to a photosensitive resin composition for a printing plate, which provides a photosensitive resin relief printing material showing an improved printing durability and an improved printing quality.

BACKGROUND ART

Generally, in printing plate materials comprising a layer composed of a photosensitive resin composition, a photosensitive resin layer contains a soluble polymer, a photopolymerizable unsaturated group-containing monomer and a photopolymerization initiator as indispensable components, and additives such as a stabilizer and a plasticizer are also incorporated therein as required. Such printing plate materials are used by forming a relief image thereon by irradiating the photosensitive resin layer with ultraviolet light through a negative or positive original image film or an image mask layer that is arranged on the photosensitive resin layer and does not transmit ultraviolet light and thereby forming a solvent-soluble part and a solvent-insoluble part in the photosensitive resin layer.

Most of the photosensitive resin relief priming materials used today are capable of forming a relief when a relief image formed by exposure is developed with water and, as the soluble polymer of the photosensitive resin layer, a water-soluble or water-swellable polymer is used.

Partially saponified polyvinyl acetates and derivatives thereof have been used in many occasions because of their solubility to water and excellent water developability; however, since they have a high crystallization degree are thus weak against impact force repeatedly applied during printing, there is such a problem that relief cracks are generated during printing.

As a method of solving the above-described problem, for example, in Patent Documents 1 and 2, it is proposed to incorporate a polyvinyl acetate derivative and a basic nitrogen-containing polyamide.

PRIOR ART REFERENCES

Patent Documents

[Patent Document 1] JP H11-65115A
[Patent Document 2] JP 2001-272776A
[Patent Document 3] JP H3-274558A
[Patent Document 4] JP H4-283749A
[Patent Document 5] JP 2007-79494A

SUMMARY OF THE INVENTION

Problems to be Solved by the Invention

As described above, there have been proposed methods of solving the problem of crack generation during printing; however, even in these methods, a satisfactory effect cannot yet be attained against crack generation caused by an impact applied in the presence of a tensile stress when pasting a relief onto the printing cylinder of a printing machine. The present invention was made in view of the above-described circumstances, and an object of the present invention is to provide a photosensitive resin composition and a photosensitive resin printing plate original, which have a high toughness and exhibit an improved printing durability.

Means for Solving the Problems

In order to achieve the above-described object, the present invention provides a photosensitive resin composition characterised by comprising: (A) a modified and partially saponified polyvinyl acetate having a reactive group in a side chain; (B) a basic nitrogen-containing polyamide; (C) a compound which has a molecular weight of 300 or less and comprises a 5 to 7-membered ring and a polymerizable ethylenic double bond; and (D) a photopolymerization initiator.

Effects of the Invention

According to the present invention, a relief printing plate in which, a relief crack is not likely to be generated even when the plate is subjected to repeated impacts during printing under a condition where a tensile stress is applied to paste a relief onto the plate cylinder of a printing machine can be obtained.

MODE FOR CARRYING OUT THE INVENTION

Modes for carrying out the present invention will not be described.

In the modified and partially saponified polyvinyl acetate having a reactive group in a side chain, which is the component (A) constituting the photosensitive resin composition, the "reactive group" refers to a functional group that can be cross-linked by a radical reaction. In general, as such a functional group, a non-aromatic unsaturated carbon-carbon bond, particularly an ethylenic double bond, is normally used in many cases, and examples thereof include a vinyl group and a (meth)acryloyl group.

As a method of introducing such a reactive group into a side chain of a partially saponified polyvinyl acetate, for example, those methods that are described in Patent Documents 3, 4 and 5 can be employed.

Patent Documents 3 and 4 describe a method of introducing a reactive group by allowing a partially saponified polyvinyl acetate to react with an acid anhydride so as to introduce a carboxyl group into a side chain of the resulting polymer using the hydroxyl group of the partially saponified polyvinyl acetate as an origin of the introduction, and then allowing the thus introduced carboxyl group to react with an unsaturated epoxy compound; and a method of introducing a reactive group by partially saponifying a polymer obtained by copolymerization between vinyl acetate and an unsaturated carboxylic acid, a salt thereof or an unsaturated carboxylic acid ester, and then allowing the carboxyl group of this polymer to react with an unsaturated epoxy compound. Particularly, a partially saponified polyvinyl acetate obtained by the former method is preferably used because a reactive group is easily introduced thereinto and the effect of the present invention is prominently exerted.

In the compound (A), such a reactive group exists in an amount of preferably 0.08 to 0.72 mol/kg, more preferably 0.12 to 0.36 mol/kg. When the amount is greater than 0.72 mol/kg, since the compound (A) has a poor solubility to water, a satisfactory level of water developability cannot be attained in many cases. Meanwhile, when the amount of less than 0.08 mol/kg, for example, an effect of improving the generation of a crack of relief during development, which is attained by reaction of the reactive group, may not be expressed in many cases. The (A) modified and partially saponified polyvinyl acetate having a reactive group obtained in this manner comprises at least the following structural units (I), (II), and (III):

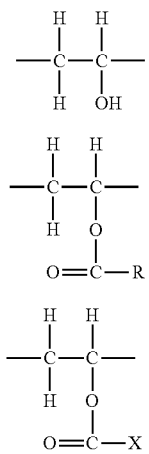

(where, R represents a hydrocarbon group having 1 to 20 carbon atoms; and X represents a functional group having an unsaturated carbon-carbon bond at a terminal).

Since the (A) partially saponified polyvinyl acetate having a reactive group is required to be developable with water, it comprises the structural unit (I) in an amount of preferably 60 to 99% by mol, more preferably 70 to 95% by mol. When the amount of the structural unit (I) is less than 60% by mol, the solubility to water is reduced, so that sufficient water developability cannot be attained in many cases, while when the amount is greater than 99% by mol, the solubility to normal-temperature water is reduced, so that sufficient water developability cannot be attained in many cases. Further, the modified and partially saponified polyvinyl acetate, which is the component (A), has an average polymerisation degree in the range of preferably 300 to 2,000, more preferably 500 to 1,000. When the average polymerization degree is lower than 300, the water resistance is reduced, so that sufficient water resistance cannot be attained. When the average polymerization degree is higher than 2,000, the solubility to water is markedly reduced, so that sufficient water developability cannot be attained.

Meanwhile, the method described in Patent Document 5 is a method of introducing a reactive group into a side chain of a partially saponified polyvinyl acetate by a reaction between the partially saponified vinyl acetate and an acrylic compound having an N-methylol group. The amount of the acrylic compound having an N-methylol group to be incorporated is in the range of preferably 2 to 40 parts by weight, more preferably 5 to 30 parts by weight, with respect to 100 parts by weight of the polyvinyl acetate. When the amount of the acrylic compound having an N-methylol group is greater than 40 parts by weight, since the solubility to water is impaired, a satisfactory level of water developability cannot be attained in many cases. Further, when the amount is less than 2 parts by weight, for example, an effect of improving the generation of a crack of relief during development, which is attained by reaction of the reactive group, may not be expressed in many cases.

Examples of the above-described acrylic compound having an N-methylol group include N-methylol acrylamide, N-methylol methacrylamide, N-methyl-N-methylol acrylamide, N-methyl-N-methylol methacrylamide, N-ethyl-N-methylol acrylamide and N-ethyl-N-methylol methacrylamide, among which N-methylol acrylamide and N-methylol methacrylamide are particularly preferred. These acrylic compounds may each be used individually, or two or more thereof may be used in combination.

The component (B) of the present invention, which is a basic nitrogen-containing polyamide, is capable of improving the problem of a crack of relief that is often generated during development and printing due to incorporation of the component (A). The basic nitrogen of the component (B) binds with the hydrogen atom of the hydroxyl group of the component (A); therefore, the component (B) has an effect of inhibiting crystallization of the component (A). However, since the component (B) readily absorbs moisture and is highly adhesive, it is not appropriate as a raw material of the photosensitive resin composition unless it is incorporated along with the component (A).

The basic nitrogen-containing polyamide is a polymer comprising a basic nitrogen as a part of the main chain or a side chain. The term "basic nitrogen" refers to a nitrogen atom constituting an amino group that is not an amide group. Examples of such a polyamide include polyamides having a tertiary amino group in the main chain. The basic a nitrogen-containing polyamide can be obtained by, for example, a polycondensation or polyaddition reaction using a basic nitrogen-containing monomer individually or along with other monomer(s). The basic nitrogen is preferably a nitrogen atom of piperazine or that of an N,N-dialkylamino group, more preferably a nitrogen atom of piperazine. Specific examples of the basic nitrogen-containing monomer used for providing the polyamide required in the present invention include diamines, such as N,N'-bis(aminomethyl)-piperazine, N,N'-bis(β-aminoethyl)-piperazine, N,N'-bis(γ-aminobenzyl)-piperazine, N,N-bis(β-aminoethyl)piperazine, N-(β-aminopropyl)piperazine, N-(ω-aminohexyl)piperzine, N-(β-aminoethyl)-2,5-dimethylpiperazine, N,N-bis(β-aminoethyl)-benzylamine, N,N-bis(γ-aminopropyl)-amine, N,N'-dimethyl-N,N'-bis(γ-aminopropyl)-ethylenediamine and N,N'-dimethyl-N,N'-bis(γ-aminopropyl)-tetramethylene diamine; dicarboxylic acids and their lower alkyl esters and acid halides, such as N,N'-bis(carboxymethyl)-piperazine, N,N'-bis(carboxymethyl)-methylpiperazine, N,N'-bis(carboxymethyl)-2,6-dimethylpiperazine, N,N'-bis(β-carboxyethyl)-piperazine, N,N-bis(carboxymethyl)-methylamine, N,N-bis(β-carboxyethyl)-ethylamine, N,N-bis(β-carboxyethyl)-methylamine, N,N-di(β-carboxyethyl)-isopropylamine, N,N'-dimethyl-N,N'-bis(carboxymethyl)-ethylenediamine and N,N'-dimethyl-N,N'-bis-(β-carboxyethyl)-ethylenediamine; and ω-amino acids, such as N-(aminomethyl)-N'-(carboxymethyl)-piperzine, N-(aminomethyl)-N'-(β-carboxyethyl)-piperzine, N-(β-aminoethyl)-N'-(β-carboxyethyl)-piperzine, N-carboxymethylpiperzine, N-(β-carboxyethyl)piperzine, N-(γ-carboxyhexyl)piperazine, N-(ω-carboxyhexyl)piperazine, N-(aminomethyl)-N-(carboxymethyl)-methylamine, N-(β-aminoethyl)-N-(β-carboxyethyl)-methylamine, N-(aminomethyl-N-(β-carboxyethyl)-isopropylamine and N,N'-dimethyl-N-(aminoethyl)-N'-(carboxymethyl)-ethylenediamine. The polyamide of the present invention can also be obtained by polymerizing these monomers along with, for example, other diamine, dicarboxylic acid, ω-amino acid and/or lactam. These basic nitrogen-containing monomer components are used in an amount of 10 to 100% by mol, more preferably 10 to 80% by mol, with respect to the total amount of the constituents of the polyamide, that is, the sum of an aminocarboxylic acid unit (including a case where lactam is used as a starting material), a dicarboxylic acid unit and a diamine structural unit. When the amount is less than 10% by mol, the resulting polyamide may have a low solubility to water and thus a reduced compatibility with the component (A).

The photosensitive resin composition of the present invention comprises (C) a compound which has a molecular weight of 300 or less and comprises a 5-7-membered ring and a polymerizable ethylenic double bond. Generally speaking, since a 5 to 7-membered ring is a bulky substituent, a compound having a 5 to 7-membered ring functions as a high barrier for molecular motion. Thus, when such a compound comprising a 5 to 7-membered ring and a polymerizable ethylenic double bone is incorporated in the photosensitive resin composition, the molecular motions of the compounds existing therearound are also restricted, so that crystallization of the component (A) is inhibited. It is believed that, as a result thereof, the durability against the impact force repeatedly applied during printing of the resin printing plate is improved. It is preferred that the compound comprising a 5 to 7-membered ring and a polymerizable ethylenic double bond further comprise a heterocycle or at least one functional group selected from a hydroxyl group, a carboxyl group and an amino group. These heterocycle and functional groups interact with the hydroxyl group of the component (A) through hydrogen bonding to improve the effect of inhibiting crystallization of the component (A) and exert an effect of improving the compatibility between the component (C) and the component (A). Meanwhile, the compound comprising a 5 to 7-membered ring and a polymerizable ethylenic double bond in the molecule is required to have a molecular weight of 300 or less. When the molecular weight is greater than 300, the compatibility with the component (A) is reduced, so that the resin composition may become opaque and the uniformity thereof may be impaired.

Specific examples of such component (C) include, but not limited to, the following compounds: benzyl (meth)acrylate, cyclohexyl (meth)acrylate, tetrahydrofurfuryl (meth)acrylate, phenoxymethyl(meth)acrylate, 2-(meth)acryloxyloxyethyl hexahydrophthalate, phenoxydiethylene glycol (meth) acrylate, 2-hydroxy-3-phenoxypropyl (meth)acrylate, 2-(meth)acryloyloxyethyl phthate, neopentyl glycol-(meth) acrylic acid-benzoate, (meth)acryloyl morpholine, styrene and derivatives thereof, vinylpyridine, N-vinyl-2-pyrrolidone, β-(meth)acryloyloxyethyl hydrogen phthalate, N-phenylmaleimide and derivatives thereof, N-(meth)acryloxy succinimide, 2-naphthyl (meth)acrylate, N-phenyl (meth) acrylamide, divinylethylene urea, divinylpropylene urea, vinylcaprolactam, vinylcarbazole, bicyclopentenyl (meth) acrylate, 1-vinyl imidazole, 2-methyl-1-vinyl imidazole, (2-methyl-ethyldioxolane-4-yl)methyl acrylate, imide acrylate, [4-(hydroxymethyl)cyclohexyl]methyl (meth)acrylate, (2-oxy-1,3-dioxolane-4-yl)methyl (meth)acrylate, 2-(oxydiimidazolidine-1-yl)ethyl (meth)acrylate and 2,2,6,6-tetramethyl-4-piperidyl acrylate.

The component (C) is contained in an amount of preferably 5 to 200 parts by weight with respect to 100 parts by weight of the component (A). When the amount is less than 5 parts by weight, the image reproducibility is insufficient, while when the amount is greater than 200 parts by weight, molding of the photosensitive resin composition tends to be difficult.

The use of the component (C) along with the component (B) inhibits crystallization of the component (A) and has an effect of improving the compatibility between the component (C) and the component (A), so that the problem of a crack of relief that is often generated during development and printing due to incorporation of the component (A) can be improved. However, when the component (A) is not incorporated, since the component (C) is highly adhesive, it is nor appropriate as a raw material of the photosensitive resin composition.

Further, in the photosensitive resin layer of the present invention, in order to adjust the image reproducibility, a compound having a polymerizable ethylenic double bond other than the component (C) may also be incorporated.

The photosensitive resin composition of the present invention comprises a photopolymerization initiator as a component (D). As the photopolymerization initiator, any photopolymerization initiator that is capable of polymerizing a polymerizable carbon-carbon unsaturated group with light can be employed. Among such photopolymerization initiators, one which has a function of generating a radical by self-decomposition or hydrogen abstraction induced by light absorption is preferably employed. Examples thereof include benzoin alkyl ethers, benzophenones, anthraquinones, benzyls, acetophenones and diacetyls. The amount of the photopolymerization initiators is preferably in the range of 0.1 to 20 parts by weight with respect to 100 parts by weight of the component (A).

In the photosensitive resin composition of the present invention, as a compatibilizing aid for improving the compatibility and flexibility, a polyhydric alcohol such as ethylene glycol, diethylene glycol, triethylene glycol, glycerin or a derivative thereof, trimethylolpropane or a derivative thereof, trimethylolethane or a derivative thereof, or pentaerythritol or a derivative thereof, can also be added. The amount of the polyhydric alcohol is preferably 30% by weight or less with respect to the total weight of the photosensitive resin composition.

In order to improve the thermal stability of the photosensitive resin composition of the present invention, a conventionally known polymerization inhibitor can be added. Examples of preferred polymerization inhibitors include phenols, hydroquinones, catechols and hydroxyamine derivatives. The amount of the polymerization inhibitor to be incorporated is generally in the range of 0.001 to 5% by weight with respect to the total weight of the photosensitive resin composition.

Further, as other components, a dye, a pigment, a surfactant, an antifoaming agent, an ultraviolet absorber, a flavoring agent and the like can be added. Particularly, as the dye, a water-soluble triphenylmethane-based dye is preferred. With the dye being soluble to water, agglutination, precipitation and the like thereof in the photosensitive resin composition are not likely to take place, making uneven coloration unlikely to occur. In addition, since a triphenylmethane-based dye is not easily discolored by the heat used in the step of molding the photosensitive resin composition and also has excellent light resistance, it stabilizes the color tone of a photosensitive composition and that of a printing plate material obtained from the photosensitive resin composition.

Specific examples of the triphenylmethane-based dye include, but not limited to, dyes selected from C.I. Acid Blue 9, C.I. Acid Blue 83, C.I. Acid Blue 90, C.I. Acid Blue 93, C.I. Acid Blue 100, C.I. Acid Blue 103, C.I. Acid Blue 104, C.I. Acid Green 3, C.I. Acid Green 5, C.I. Acid Green 9 and C.I. Food Green 3. The amount of such a dye to be contained in the photosensitive resin composition is preferably 0.001% by weight to 0.2% by weight. By using a dye in this range, the relief formed on the printing plate material can have satisfactory distinguishability.

Next, the photosensitive resin printing plate original of the present invention will be described. The photosensitive resin printing plate original of the present invention comprises at least a support (E) and a photosensitive resin layer (F) which is formed from the above-described photosensitive resin composition of the present invention.

As the support (E), for example, a plastic sheet made of polyester or the like, a synthetic rubber sheet made of styrene-butadiene rubber or the like, or a metal plate made of steel, stainless-steel, aluminum or the like can be employed.

The thickness of the support is not particularly restricted; however, from the standpoints of the ease of handling and the flexibility, it is preferably in the range of 100 to 350 µm. The ease of handling the support is improved at a thickness of 100 µm or more, while the flexibility of the printing plate original is improved when the support has a thickness of 350 µm or less.

It is preferred that the support (E) be subjected to an adhesion-promoting treatment for the purpose of improving its adhesion with the photosensitive resin layer (F). Examples of the adhesion-promoting treatment include mechanical treatments such as sand blasting; physical treatments such as corona discharge; and chemical treatments by coating or the like; however, from the standpoint of the resulting adhesiveness, it is preferred to arrange an adhesion-promoting layer (G) by coating.

The photosensitive resin layer (F) is formed from the above-described photosensitive resin composition. From the standpoint of allowing the photosensitive resin layer (F) to have a sufficient relief depth and thereby improving the printability, the thickness of the photosensitive resin layer (F) is preferably not less than 0.3 mm, more preferably not less than 0.5 mm. On another front, from the standpoint of allowing an active light used for exposure to sufficiently reach the bottom part and thereby further improving the image reproducibility, the thickness of the photosensitive resin layer (F) is preferably 5 mm or less, more preferably 3 mm or less.

From the standpoints of protecting the surface and inhibiting adhesion of foreign matters and the like, it is preferred that the photosensitive resin printing plate original of the present invention also comprise a cover film (H) on the photosensitive resin layer (F). The photosensitive resin layer (F) and the cover film (H) may be in direct contact with each other, or one or more layers may be arranged therebetween. Examples of a layer to be arranged between the photosensitive resin layer (F) and the cover film (H) include an anti-adhesion layer arranged for the purpose of inhibiting adhesion of the surface of the photosensitive resin layer.

The material of the cover film (H) is not particularly restricted, and a plastic film made of polyester, polyethylene or the like is preferably used. The thickness of the cover film (H) is also not particularly restricted; however, from the standpoints of the ease of handling and the cost, it is preferably in the range of 10 to 150 µm. Further, the surface of the cover film may be roughened for the purpose of improving its adhesion with an original image film.

The photosensitive resin printing plate original of the present invention may further comprise a heat-sensitive mask layer (I) on the photosensitive resin layer (F). It is preferred that the heat-sensitive mask layer (I) have a function of substantially blocking ultraviolet light and absorb infrared last light at the time of image formation to be, by the heat thereof, partially or entirely evaporated or ablated in an instant. This generates a difference in optical density between the laser-irradiated part and the non-irradiated part, enabling the heat-sensitive mask layer (I) to function in the same manner as a conventional original image film.

Here, the expression "have a function of blocking ultraviolet light" means that the heat-sensitive mask layer (I) has an optical density of 2.5 or higher, preferably 3.0 or higher. The optical density is generally represented by "D" and it is defined by the following equation:

$$D = \log_{10}(100/T) = \log_{10}(I_0/I)$$

(wherein, T represents the transmittance (%), $I_0$ represents the intensity of the incident light used in the measurement of the transmittance; and I represents the intensity of the transmitted light).

In the measurement of the optical density, there are known a method of calculating the optical density from a measured value of the intensity of the transmitted light with the intensity of the incident light being set constant, and a method of calculating the optical density from a measured value of the intensity of the incident light required for achieving a certain intensity of the transmitted light. In the present invention, the optical density refers to a value calculated from the intensity of the transmitted light as in the former method.

The optical density can be measured using a Macbeth transmission densitometer "TR-927" (manufactured by Kollorgen Instrument Corp.) along with an orthochromatic filter.

One specific example of preferred heat-sensitive mask layer (I) is a resin in which an infrared-absorbing substance is dispersed. The infrared-absorbing substance is not particularly restricted as long as it is a substance capable of absorbing infrared light and converting it into heat. Examples thereof include black pigments such as carbon black, aniline black and cyanine black; phthalocyanine-based and naphthalocyanine-based green pigments; rhodamine dyes; naphthoquinone dyes; polymethine dyes; diimonium salts; azoimonium dyes; chalcogen dyes, carbon graphite; iron powders; diamine-based metal complexes; dithiol-based metal complexes; phenol thiol-based metal complexes; mercaptophenol-based metal complexes; aryl aluminum metal salts; crystal water-containing inorganic compounds; copper sulfate; chromium sulfide; silicate compounds; metal oxides such as titanium oxide, vanadium oxide, manganese oxide, iron oxide, cobalt oxide and tungsten oxide; hydroxides and sulfates of these metals; and metal powders of bismuth, tin, tellurium, iron, aluminum and the like.

Thereamong, carbon black is particularly preferred from the standpoints of the photothermal conversion rate, economic efficiency and ease of handling as well as the below-described ultraviolet-absorbing function. A resin component to be used as a binder is not particularly restricted; however, from the standpoints of the stability and the scratch resistance of the heat-sensitive mask layer (I), a thermosetting resin can be preferably used.

The photosensitive resin printing plate original of the present invention may also comprise an adhesion-adjusting layer (J) between the photosensitive resin layer (F) and the heat-sensitive mask layer (I). It is preferred that the adhesion-adjusting layer (J) contain a water-soluble and/or water-dispersible resin, such as a partially saponified polyvinyl acetate having a saponification degree of not less than 30% by mol or a polyamide. Further, the adhesion-adjusting layer (J) may also contain a resin or monomer for optimization of the adhesive strength and/or an additive(s) such as a surfactant and a plasticizer for ensuring coating performance and stability.

The thickness of the adhesion-adjusting layer (J) is preferably 15 μm or less, more preferably not less than 0.1 μm but not greater than 5 μm. As long as the thickness is 15 μm or less, refraction and scattering of light caused by the layer when exposed to ultraviolet light are inhibited, so that a sharper relief image can be obtained. Further, the adhesion-adjusting layer (J) can be easily formed when its thickness is 0.1 μm or greater.

The photosensitive resin printing plate original of the present invention may also comprise a peel assist layer (K) on the heat-sensitive mask layer (I). The peel assist layer (K) is preferably arranged between the heat-sensitive mask layer (I) and the cover film (H). In cases where the cover film (H) and the heat-sensitive mask layer (I) are laminated adjacently to each other without the peel assist layer (K) therebetween and the adhesion between the two layers is thus strong, the cover film (H) cannot be peeled off or, when it is peeled off, the heat-sensitive mask layer (I) may be partially left adhered to the side of the cover film (H) to cause a void on the heat-sensitive mask layer (I).

Therefore, it is preferred that the peel assist layer (K) be constituted by a substance that strongly adheres to the heat-sensitive layer (I) but weakly adheres to the cover film (H) such that it can be peeled off, or by a substance that strongly adheres to the cover film (H) but weakly adheres to the heat-sensitive mask layer (I) such that it can be peeled off. In the former case, the peel assist layer (K) remains on the heat-sensitive mask layer (I) and only the cover film (H) is peeled off. In the latter case, the cover film (H) and the peel assist layer (K) are peeled off together from the heat-sensitive mask layer (I). In cases where, after the cover film (H) is peeled off, the peel assist layer (K) remains on the side of the heat-sensitive mask layer (I) and serves as the outermost layer, it is preferred that the peel assist layer (K) be not adhesive from the standpoint of the ease of handling and be substantially transparent for performing exposure with ultraviolet light therethrough.

Examples of a material of the peel assist layer (K) include polyvinyl alcohols, polyvinyl acetates, partially saponified polyvinyl alcohols, hydroxyalkyl celluloses, alkyl celluloses and polyamide resins, and it is preferred that the peel assist layer (K) contains, as a main component, a resin that is soluble or dispersible in water and weakly adhesive. Among the above-described materials, from the standpoint of the adhesiveness, partially saponified polyvinyl alcohols having a saponification degree of 60 to 99% by mol as well as hydroxyalkyl celluloses and alkyl celluloses whose alkyl groups have 1 to 5 carbon atoms can be particularly preferably used.

The peel assist layer (K) may further contain an infrared-absorbing substance so as to be easily melted and removed using infrared radiation. Examples of the infrared-absorbing substance that can be used include the same ones as those exemplified above in relation to the heat-sensitive mask layer (I). In addition, in order to improve the coating properties, wettability, and peeling properties, a surfactant may be incorporated into the peel assist layer (K). Particularly, when the peel assist layer (K) contains a phosphate-based surfactant, its peeling from the cover film (H) is improved.

The thickness of the peel assist layer (K) is preferably 6 μm or less, more preferably not less than 0.1 μm but not greater than 1 μm. As long as the thickness if 6 μm or less, the heat-sensitive mask layer (I) arranged underneath can be melted and removed using laser, and this melt-removal using laser can be easily performed when the thickness is 1 μm or less. Further, the peel assist layer (K) can be easily formed when its thickness is 0.1 μm or greater.

Next, the method of producing the photosensitive resin composition of the present invention and the method of producing a photosensitive resin printing plate original using the photosensitive resin composition will be described. For example, after heat-dissolving the components (A) and (B) into a water/alcohol mixed solvent, the (C) ethylenically unsaturated compound, the (D) photopolymerization initiator and, as required, a plasticizer and other additive(s) are added, and the resultant is sufficiently mixed by stirring to obtain a photosensitive resin composition solution.

The thus obtained photosensitive resin composition solution is flow-cast on the support (E), which comprises the adhesion-promoting layer (G) as required, and subsequently dried to form a photosensitive resin layer (F). Then, by tightly adhering the cover film (H), which is coated with an anti-adhesion layer as required, onto the thus formed photosensitive resin layer (F), a photosensitive resin printing plate original can be obtained. Alternatively, a photosensitive resin printing plate original can also be obtained by preparing a photosensitive resin sheet by dry film formation and then laminating the support (E) and the cover film (H) such that the photosensitive sheet is sandwiched therebetween.

In cases where the photosensitive resin printing plate original comprises the heat-sensitive mask layer (I), the method of forming the heat-sensitive mask layer (I) is not particularly restricted. For example, the heat-sensitive mask layer (I) can be formed by dissolving and diluting a resin, in which carbon black is dispersed, with an appropriate solvent; coating the resulting solution on the photosensitive resin layer (F); and then drying the solvent. Alternatively, the heat-sensitive mask layer (I) can also be formed by coating the above-described carbon black solution on the cover film (H) and then laminating this cover film (H) and the support (E) such that the photosensitive resin layer (F) is sandwiched therebetween.

In cases where the photosensitive resin printing plate original comprises the adhesion-adjusting layer (J), the method of forming the adhesion-adjusting layer (J) is not particularly restricted. From the standpoint of the simplicity of forming a thin film, a method where a solution in which an adhesion-adjusting layer (J) component is dissolved in a solvent is coated on the heat-sensitive mask layer (I) and the solvent is subsequently removed is particularly preferably employed. Examples of a method of removing the solvent include hot-air drying, far-infrared drying and natural drying. The solvent used for dissolving the adhesion-adjusting layer (J) component is also not particularly restricted; however, water, an alcohol or a mixture of water and an alcohol is preferably used. In cases where water or an alcohol is used as the solvent, the heat-sensitive mask layer (I) is preferably insoluble to water because, even if the solvent is coated thereon, the heat-sensitive mask layer (I) is not corroded by the solvent.

In cases where the photosensitive resin printing plate original comprises the peel assist layer (K), the method of forming the peel assist layer (K) is not particularly restricted. From the standpoint of the simplicity of forming a thin film, a method where a solution in which a peel assist layer (K) component is dissolved in a solvent is coated on the cover film (H) and the solvent is subsequently removed is particularly preferably employed. Examples of a method of removing the solvent include hot-air drying, far-infrared drying and natural drying. The solvent used for dissolving the peel assist layer (K) component is also not particularly restricted; however, water, an alcohol or a mixture of water and an alcohol is preferably used.

The resin priming plate of the present invention will now be described. The resin printing plate of the present invention is obtained by exposing and developing the above-described photosensitive resin printing plate original of the present invention.

For example, in cases where the photosensitive resin printing plate original is not equipped with the heat-sensitive mask layer (I) hereinafter, referred to as "analog plate") but with the cover film (H), a negative or positive original image film is tightly adhered onto the photosensitive resin layer (F) from which the cover film (H) has been peeled off and the original image film is then irradiated with UV, thereby the photosensitive resin layer (F) is photocured. Further, in cases where the photosensitive resin printing plate original is co-called CTP (Computer-to-Plate) plate that comprises the heat-sensitive mask layer (I), after the cover film (H) is peeled off, an image corresponding to an original image film is drawn using a laser imaging apparatus and the thus drawn image is subsequently irradiated with UV, thereby the photosensitive resin layer (F) is photocured. The UV irradiation is usually performed using, for example, a high-pressure mercury lamp, an ultrahigh-pressure mercury lamp, a metal halide lamp, a xenon lamp, a carbon arc lamp or a chemical lamp, which is capable of emitting a light having a wavelength of 300 to 400 nm. Particularly, in cases where the reproducibility of fine lines and dots is required, it is also possible to perform exposure from the side of the support (E) (back exposure) for a short time before peeling off the cover film (H).

Then, the photosensitive resin printing plate original is immersed in a developer solution and a relief image is formed on a substrate using a brush-type developing apparatus which reveals uncured portion by rubbing with a brush. Alternatively to a brush-type developing apparatus, it is also possible to use a spray-type developing apparatus. As the developer solution, it is preferred to use water or surfactant-added water. The temperature of the developer solution at the time of performing development is preferably 15 to 40° C. After the formation of a relief image, the resulting priming plate original is dried at 50 to 70° C. for about 10 minutes and, as required, subjected to a treatment with an active light in the air or vacuum, thereby a resin printing plate can be obtained.

In cases where a water-soluble triphenylmethane-based dye is added to the photosensitive resin composition, in the photosensitive resin layer of the resulting resin printing plate, the color difference ($\Delta E^*ab$), which is determined using the following equation (1) based on the L*a*b* color system coordinate of the part of the substrate from which non-exposed portion was removed and the part where the exposed photosensitive resin layer remained as a relief layer after development, is in the range of preferably 5 to 70, more preferably 12 to 50:

$$\Delta E^*ab=[(\Delta L^*)^2+(\Delta a^*)^2+(\Delta b^*)^2]^{1/2} \quad (1)$$

When the color difference ($\Delta E^*ab$) is larger than 5, an adhesive layer-containing part of the substrate can be easily distinguished from an adhesive layer-containing part of the substrate that has a relief layer formed from the photosensitive resin layer. Meanwhile, when the color difference ($\Delta E^*ab$) is smaller than 70, relief-outlined character parts can be easily identified.

The photosensitive resin composition of the present invention is most suitably used for relief printing; however, it can also be used as a photoresist for planographic printing, intaglio printing or stencil printing.

EXAMPLES

The present invention will now be described in detail by way of examples thereof.

Modification of Modified and Partially Saponified Polyvinyl Acetate

Synthesis Example 1

A partially saponified polyvinyl acetate manufactured by The Nippon Synthetic Chemical Industry Co., Ltd., "KL-05" (polymerization degree: about 500, saponification degree: 80% by mol), was swollen in acetone and 1.0% by mol of succinic anhydride was added thereto. The resultant was stirred at 60° C. for 6 hours to add a carboxyl group to the molecular chain. The resulting polymer was washed with acetone and unreacted succinic anhydride was removed by drying. The acid value of this polymer was measured to be 10.0 mgKOH/g. Then, 100 parts by weight of the polymer was dissolved in 200 parts by weight of a mixed solvent (ethanol/water=30/70 (weight ratio)) at 80° C. Thereafter, 6 parts by weight of glycidyl methacrylate was added to introduce a reactive group into the partially saponified polyvinyl acetate. As a result of an analysis by a potentiometric titration method, it was confirmed that the carboxyl group contained in the polymer reacted with the epoxy group of glycidyl methacrylate and a methacryloyl group was introduced into a side chain of the polymer, thereby a modified and partially saponified polyvinyl acetate A1 was obtained as a component (A).

Synthesis Example 2

A polymer containing 1% by mol of methacrylic acid as a unit copolymerized with vinyl acetate was saponified to obtain an anion-modified polyvinyl acetate having an average polymerization degree of 650 and a saponification degree of 75% by mol. Then, 100 parts by weight of this polymer was dissolved in 200 parts by weight of a mixed solvent (ethanol/water=30/70 (weight ratio)) at 80° C. Thereafter, 6 parts by weight of glycidyl methacrylate was added thereto to introduce a reactive group into the partially saponified polyvinyl acetate. As a result of an analysis by a potentiometric titration method, it was confirmed that the carboxyl group contained in the polymer reacted with the epoxy group of glycidyl methacrylate and a methacryloyl group was introduced into a side chain of the polymer, thereby a modified and partially saponified polyvinyl acetate A2 was obtained as the component (A).

Synthesis Example 3

First, 100 parts by weight of a partially saponified polyvinyl acetate manufactured by The Nippon Synthetic Chemical Industry Co., Ltd., "KL-05" (polymerization degree: about 500, saponification degree: 80% by mol), was dissolved in 100 parts by weight of water. Subsequently, 15 parts by weight of N-methylolacrylamide was added thereto and, as an acid catalyst, 1 part by weight of phosphoric acid was further added. The resultant was adjusted with stirring at 100° C. for 4 hours and water was then removed, as a result of which a modified and partially saponified polyvinyl acetate A3 was obtained as the component (A) by a reaction with the acrylic compound having an N-methylol group.

Synthesis of Basic Nitrogen-Containing Polyamide

Synthesis Example 4

To a stainless-steel autoclave, 10 parts by weight of ε-caprolactam, 90 parts by weight of a nylon salt of N-(2-aminoethyl)piperazine and adipic acid, and 100 parts by weight of water were loaded. After replacing the atmosphere inside the autoclave with nitrogen gas, the loaded materials were heated at 180° C. for 1 hour and water was then removed, thereby a water-soluble polyamide resin was obtained as a basic nitrogen-containing polyamide.

Compound Having Polymerizable Ethylenic Double Bond

As compounds having a polymerizable ethylenic double bond, those that are shown in Table 1 were used.

methacrylate, manufactured by NOF Corporation) was added and the resultant was mixed for 1 hour. Further, 3 parts by weight of a copolymer having a weight ratio, (dimethylaminoethyl methacrylate)/(2-hydroxyethyl methacrylate)/(methacrylic acid), of 2/1 (manufactured by Kyoeisha Chemical Co., Ltd.), 5 parts by weight of "IRGACURE" (registered trademark) 651 (benzyl methyl ketal, manufactured by Ciba-Geigy Ltd.), 21 parts by weight of "EPOXY ESTER 70PA" (an acrylic acid adduct of propylene glycol diglycidyl ether, manufactured by Kyoeisha Chemical Co., Ltd.) and 20 parts by weight of ethylene glycol diglycidyl ether dimethacrylate were added, and the resultant was mixed for 90 minutes. After cooling the resulting mixture to 50° C., 0.1 parts by weight of "MEGAFACE F-470" (manufactured by DIC Corporation) was added thereto and mixed for 30 minutes, thereby a coating solution 2 for an adhesion-promoting layer was obtained.

The coating solution 1 for an adhesion-promoting layer was coated on 250 μm-thick "LUMIRROR" (registered trademark) T60 (a polyester film, manufactured by Toray Industries, Inc.) using a bar coater such that the resulting

TABLE 1

| | | Number | Name | CAS | Molecular weight | 5 to 7-membered ring |
|---|---|---|---|---|---|---|
| Compound having a polymerizable ethylenic double bond | Compound corresponding to the component (C) | C1 | 2-hydroxy-3-phenoxypropyl acrylate | 16969-10-1 | 223 | present |
| | | C2 | phenoxydiethylene glycol acrylate | 61630-25-9 | 236 | present |
| | | C3 | tetrahydrofurfuryl methacrylate | 2399-48-6 | 156 | present |
| | | C4 | acryloyl morpholine | 5117-12-4 | 141 | present |
| | | C5 | 2-acryloyloxyethyl phthalate | 30697-40-6 | 264 | present |
| | Compound not corresponding to component (C) | C1 | 2-acryloyloxyethyl-2-hydroxyethyl phthalate | 38056-88-1 | 308 | present |
| | | C2 | 2-hydroxypropyl acrylate | 25584-83-2 | 129 | absent |
| | | C3 | methoxy-triethylene glycol acrylate | 32171-39-4 | 218 | absent |
| | | C4 | glycerol dimethacrylate | 1830-76-0 | 228 | absent |
| | | C5 | polyalkylene glycol (PEG200) diacrylate | 26570-48-9 | 304 | absent |
| | | C6 | 2-hydroxy-3-acryloyloxypropyl methacrylate | 1709-71-3 | 214 | absent |
| | | C7 | acrylic acid adduct of propylene glycol diglycidyl ether | 72928-42-8 | 332 | absent |

Preparation of Substrate (E1) Having Adhesion-Promoting Layer (G1)

A mixture of 260 parts by weight of "VYLON" (registered trademark) 31SS (a toluene solution of an unsaturated polyester resin, manufactured by Toyobo Co., Ltd.) and 2 parts by weight of "PS-8A" (benzoin ethyl ether, manufactured by Wako Pure Chemical Industries, Ltd.) was heated at 70° C. for 2 hours and then cooled to 30° C. Subsequently, 7 parts by weight of ethylene glycol diglycidyl ether dimethacrylate was added thereto and mixed for 2 hours. Further, 25 parts by weight of "CORONATE" (registered trademark) 3015E (an ethyl acetate solution of a polyvalent isocyanate resin, manufactured by Nippon Polyurethane Industry Co., Ltd.) and 14 parts by weight of "EC-1368" (an industrial adhesive, manufactured by Sumitomo 3M Ltd.) were added and the resultant was mixed, thereby a coating solution 1 for an adhesion-promoting layer was obtained.

First, 50 parts by weight of "GOHSENOL" (registered trademark) KH-17 (a polyvinyl alcohol having a saponification degree of 78.5 to 81.5% by mol, manufactured by The Nippon Synthetic Chemical Industry Co., Ltd.) was admixed at 70° C. for 2 hours in a mixed solvent of 200 parts by weight of "SOLMIX" (registered trademark) H-11 (an alcohol mixture, manufactured by Japan Alcohol Trading Co., Ltd.) and 200 parts by weight of water. Then, 1.5 parts by weight of "BLEMMER" (registered trademark) G (glycidyl layer would have a post-drying thickness of 40 μm. Then, after removing the solvent by heating in a 180° C. oven for 3 minutes, the coating solution 2 for an adhesion-promoting layer was further coated using a bar coater such that the resulting layer would have a post-drying thickness of 30 μm. Thereafter, the resultant was heated in a 160° C. oven for 3 minutes, thereby a substrate (E1) having an adhesion-promoting layer (G1) was obtained.

Preparation of Substrate (E2) Having Adhesion-Promoting Layer (G2)

In 2,000 parts by weight of a mixed solvent (toluene/methyl ethyl ketone=80/20 (weight ratio)) heated to 80° C., 100 parts by weight of an organic solvent-soluble polyester resin, "NICHIGO POLYESTER" LP-035 (manufactured by The Nippon synthetic Chemical Industry Co., Ltd.; molecular weight: about 20,000), was dissolved. After cooling the resultant, 170 parts by weight hexamethylene diisocyanate, 60 parts by weight of "EPIKOTE" 828 (manufactured by Yuka Shell Epoxy K.K.; molecular weight: about 380), 50 parts by weight of "EPON" DMP-30 (manufactured by Nacalai Tesque, Inc.), 1 part by weight of ethyl methyl imidazole and 50 parts by weight of an azo-type yellow pigment, "YELLOW" PR359 (manufactured by Sumika Color Co., Ltd.), were further added as a polyvalent isocyanate, an epoxy compound, an epoxy curing agent, a curing catalyst and a halation inhibitor, respectively. The resultant was sufficiently mixed by stirring to obtain a coating solution 3 for an adhesion-promoting layer.

To 200 parts by weight of a mixed solvent (ethanol/water=50/50 (weight ratio)), 20 parts by weight of the modified polyvinyl alcohol obtained in Synthesis Example 1 was added and dissolved at 70° C. over a period of 3 hours. Then, 2 parts by weight of glycidyl acrylate was added thereto, and the resultant was stirred for 30 minutes to obtain a coating solution 4 for an adhesion-promoting layer.

The thus obtained coating solution 3 for an adhesion-promoting layer was coated on a chrome-plated steel sheet (thickness: 250 µm) using a roll coater such that the resulting layer would have a post-drying thickness of 10 µm. Then, after removing the solvent by heating in a 250° C. oven for 1 minute, the coating solution 4 for an adhesion-promoting layer was further coated using a roll coater such that the resulting layer would have a post-drying thickness of 5 µm. Thereafter, the resultant was heated in a 160° C. oven for 1 minute to remove the solvent, thereby a substrate (E2) having an adhesion-promoting layer (G2) was obtained.

Preparation of Cover Film (H1) for Analog Plate

On a 100 µm-thick "LUMIRROR" S10 (a polyester film, manufactured by Toray Industries, Inc.) whose surface had been roughened to have a surface roughness Ra of 0.1 to 0.6 µm, "GOHSENOL" AL-06 (a partially saponified polyvinyl alcohol having a saponification degree of 91 to 94% by mol, manufactured by The Nippon Synthetic Chemical Industry Co., Ltd.) as coated such that the resulting layer would have a dry thickness of 1 µm. The resultant was dried at 100° C. for 25 seconds to obtain a cover film H1 for an analog plate, on which an anti-adhesion layer was coated.

Preparation of Cover Film (H2) for CTP Plate

In a mixture of 40 parts by weight of water, 20 parts by weight of methanol, 20 parts by weight of n-propanol and 10 parts by weight of n-butanol, 10 parts by weight of "GOHSENOL" KL-05 (a polyvinyl alcohol having a saponification degree of 78 to 82% by mol, manufactured by The Nippon Synthetic Chemical Industry Co., Ltd.) was dissolved, thereby a coating solution for an adhesion-adjusting layer (J) was obtained.

A mixture of 23 parts by weight of "MA-100" (carbon black, manufactured by Mitsubishi Chemical Corporation), 1 part by weight of "DIANAL" (registered trademark) BR-95 (an alcohol-insoluble acrylic resin, manufactured by Mitsubishi Rayon Co., Ltd.), 6 parts by weight of a plasticizer "ATBC" (acetyl tributyl citrate, manufactured by J-PLUS Co., Ltd.) and 30 parts by weight of diethylene glycol monoethyl ether monoacetate, which mixture had been prepared in advance, was kneaded and dispersed using a 3-roll mil to prepare a carbon black dispersion. To the thus obtained carbon black dispersion, 20 parts by weight of "ARALDITE 6071" (an epoxy resin, manufactured by Asahi Ciba Co., Ltd.), 27 parts by weight of "U-VAN" (registered trademark) 62 (a melamine resin, manufactured by Mitsui Chemicals, Inc.), 0.7 parts by weight of "LIGHT ESTER P-1M" (a phosphate monomer, manufactured by Kyoeisha Chemical Co., Ltd.) and 140 parts by weight of methyl isobutyl ketone were added, and the resulting dispersion was stirred for 30 minutes. Then, methyl isobutyl ketone was further added to a solid concentration of 33% by weight, thereby a coating solution for a heat-sensitive mask layer (I) was obtained.

In a mixture of 55 parts by weight of water, 14 parts by weight of methanol, 10 parts by weight of n-propanol and 10 parts by weight of n-butanol, 11 parts by weight of "GOHSENOL" AL-06 (a polyvinyl alcohol having a saponification degree of 91 to 94% by mol, manufactured by The Nippon Synthetic Chemical Industry Co., Ltd.) was dissolved, thereby a coating solution for a peel assist layer (K) was obtained.

On a 100 µm-thick "LUMIRROR" S10 (a polyester film, manufactured by Toray Industries, Inc.) whose surface was not subjected to a roughening treatment, the thus obtained coating solution for a peel assist layer (K) was coated using a bar coater such that the resulting layer would have a dry thickness of 0.25 µm. The resultant was dried at 100° C. for 25 seconds to obtain a laminate of peel assist layer (K)/cover film (H). On the side of the peel assist layer (K) of the thus obtained laminate, the coating solution for a heat-sensitive mask layer (I) was coated using a bar coater such that the resulting layer would have a dry thickness of 2 µm. The resultant was subsequently dried at 140° C. for 30 seconds to obtain a laminate of heat-sensitive mask layer (I)/peel assist layer (K)/cover film (H). On the side of the heat-sensitive mask layer (I) of the thus obtained laminate, the coating solution for an adhesion-adjusting layer (J) was coated using a bar coater such that the resulting layer would have a post-drying thickness of 1 µm. The resultant was subsequently dried at 180° C. for 30 seconds to obtain a cover film H2 for a CTP plate, which had a constitution of adhesion-adjusting layer (J)/heat-sensitive mask layer (I)/peel assist layer (K)/cover film (H). The optical density (using an orthochromatic filter, transmission mode) of this cover film H2 (laminate of J/I/K/H), which was determined taking the value of the cover film H as 0, was 3.6

Evaluation Methods

Evaluations in Examples and Comparative Examples were performed by the following methods.
(1) Elongation at Break
Using a platemaking apparatus DX-A3 (manufactured by Takano Machinery Works, Co., Ltd.) equipped with a chemical lamp 20-Watt FL20SBL-360 (manufactured by Mitsubishi Electric Corporation), the entire surface of a 10 cm×10 cm, 600 µm-thick sheet made of a photosensitive resin composition (photosensitive resin sheet) was exposed in the air (exposure dose: 2,400 mJ/cm$^2$). Then, in the brush-equipped development tank of the platemaking apparatus, the thus exposed sheet was developed with 25° C. tap water for 1.5 minutes and subsequently dried at 60° C. for 10 minutes. The entire surface of the resulting sheet was once again exposed in the air under the chemical lamp (exposure dose: 2,400 mJ/cm$^2$) to prepare a resin sheet. The thus obtained resin sheet was then cut into a shape of 10 mm in width and 20 mm in length of a parallel part, thereby a sheet for measurement of the elongation at break was prepared.

Thereafter, on a TENSILON universal material tester RTM-100 (manufactured by Orientee Co., Ltd.) equipped with a 100 kgf load cell, the parallel part of the thus obtained sheet for measurement was set at a chuck distance of 1 cm. The sheet was stretched at a rate of 100 mm/min to measure the elongation at break.
(2) Image Reproducibility
(i) In the Case of an Analog Plate
From a 10 cm×10 cm photosensitive resin printing plate original, only the polyester film of the cover film (H1) was peeled off (after this peeling, the partially saponified polyvinyl alcohol layer having a dry thickness of 1 µm constituted the outermost surface of the photosensitive resin printing plate original), and a gray-scale negative film for sensitivity measurement and a negative film for evaluation of image reproducibility (having 150-line 4% half-tone and ϕ200 dots) were vacuum-adhered thereto. The resulting printing plate original was exposed using a chemical lamp 20-Watt FL20SBL-360 (manufactured by Mitsubishi Electric Osram Ltd.) under such a condition that a gray-scale sensitivity of 16±1 steps was attained (main exposure). Then using water as a developer and a brush-type developing apparatus having a developer temperature of 25° C., the thus exposed priming plate original was developed and subsequently dried at 60° C. for 10 minutes. Thereafter, the resulting printing plate original was further subjected to post exposure using the chemical lamp 20-Watt FL-20SBL-360 (manufactured by Mitsubishi Electric Osram Ltd.) under the same conditions as in the main exposure, thereby a printing plate for evaluation of image reproducibility was obtained.

(ii) In the Case of a CTP Plate

From a 10 cm×10 cm photosensitive resin printing plate original, only the polyester film of the cover film (H2) for a CTP plate was peeled off (after this peeling, the peel assist layer (K) constituted the outermost surface of the photosensitive resin printing plate original), and the printing plate original was mounted on an external drum-type plate setter "CDI SPARK" (manufactured by Esko-graphics Co., Ltd.) equipped with a fiber laser whose emission is in the infrared region, in such a manner that the support side came into contact with the drum. Subsequently, a test pattern (having 150-line 4% half-tone, 50 μm-width fine lines, ϕ120-μm dots and 300 μm-width reverse lines) was drawn at a laser output of 9 kW and a drum rotation rate of 700 rpm, and an image mask (1-I) was formed from the heat-sensitive mask layer (I). Then, the side of the heat-sensitive mask layer was exposed in the air under a chemical lamp 20-Watt FL20SBL-360 (manufactured by Mitsubishi Electric Osram Ltd.) (main exposure). Here, the time of the main exposure was twice as long as the time of the main exposure required for an analog plate having the same photosensitive resin layer. Thereafter, using water as a developer and a brush-type developing apparatus having a developer temperature of 25° C., the thus exposed printing plate original was developed and subsequently dried at 60° C. for 10 minutes. The printing plate original was further subjected to post exposure under the same conditions as in the main exposure, thereby a printing plate for evaluation of image reproducibility was obtained.

For each of the thus obtained printing plates, the half-tone and dots were evaluated.

Half-tone: A 150-line 4% half-tone formed in an area of 1 cm×1 cm was observed under a magnifying glass at a magnification of ×20 and, based on the following scoring criteria, whether or not the half-tone was reproduced at a site of tight adhesion with a negative film was evaluated. A score of 4 or higher was regarded as satisfactory.

5: No missing of the half-tone was observed.
 4: Missing of the half-tone was observed in the area of the outermost periphery.
 3: Missing of the half-tone was observed in the areas of the outermost periphery and the second row therefrom.
 2: Missing of the half-tone was observed in the interior area including the third row from the outermost periphery.
 1: Missing of the half-tone was observed in 20% or more of the entire half-tone area.

Dots: Three dots were visually observed and the number of the reproduced dots was measured.

(3) Evaluation of Relief Crack Generation

Using a M-3 printability tester (manufactured by Miyakoshi Printing Machinery Co., Ltd.), 5 printing plates each having a 1 cm×3 cm solid pattern were rotated 50,000 times, 100,000 times, 150,000 times and 200,000 times at a press-in amount of 300 μm. Then, the relief surface of each printing plate was observed under a light microscope at a magnification of ×10 to measure the number of the printing plates on which a relief crack of 100 μm or larger was generated.

(4) Color Difference

On each of the resin printing plates prepared in the above (2), the L*a*b* color system coordinate was measured using a differential colorimeter CR-321 (manufactured by Konica Minolta, Inc.) for the part of the substrate from which non-exposed portion of the above-described photosensitive resin layer was removed by development and the part where the exposed photosensitive resin layer remained as a relief layer after the development. In the measurement of each printing plate material in which a plastic sheet was placed on a support, a sample was placed on a white paper (L*:92.37, a*:0.19, b*:−0.34) and the L*a*b* color system coordinate thereof was measured. Here, the color difference (ΔE*ab) was calculated from the thus obtained color coordinate, using the above-described equation (1).

When the color difference (ΔE*ab) is in the range of 5 to 70, it can be said that the resin printing plate has particularly excellent visual distinguishability.

Example 1

Preparation of Composition Solution 1 for Photosensitive Resin Composition 1

The components (A) and (B) shown in Table 2 were added to a three-necked flask equipped with a stirring blade and a condenser tube, and these components were then mixed with a mixed solvent composed of 50 parts by weight of "SOL-MIX" (registered trademark) H-11 (an alcohol mixture, manufactured by Japan Alcohol Trading Co., Ltd.) and 50 parts by weight of water. The resulting mixture was heated at 90° C. for 2 hours to dissolve the components (A) and (B). After cooling the resultant to 70° C., other components were added thereto and the resulting mixture was stirred for 30 minutes to obtain a composition solution 1 for photosensitive resin composition 1.

Production of Photosensitive Resin Sheet 1

The thus obtained composition solution 1 for photosensitive resin composition 1 was flow-cast on a polyester film and dried at 60° C. for 2 hours. The film was then removed to obtain a 650 μm-thick photosensitive resin sheet 1. The thickness of this photosensitive resin sheet 1 was adjusted by placing a spacer having a prescribed thickness on a substrate and scraping out the composition solution 1 from a protruding part using a horizontal metal ruler.

Production of Photosensitive Resin Printing Plate Original 1

The thus obtained photosensitive resin composition solution was flow-cast on the above-described support (E1) having the adhesion-promoting layer (G1) and dried at 60° C. for 2.5 hours. Here, the post-drying thickness of the resulting plate (polyester film+photosensitive resin layer) was controlled to be 0.95 mm. On the photosensitive resin layer obtained in this manner, a mixed solvent (water/ ethanol=50/50 (weight ratio)) was coated and the above-described cover film (H1) for an analog plate was press-adhered to the surface, thereby a photosensitive resin printing plate original was obtained. The properties of the thus obtained photosensitive resin printing plate original were evaluated by the above-described methods and the results thereof are shown in Table 4. Here, the image reproducibility was evaluated in accordance with the evaluation method for an analog plate.

Examples 2, 4 to 9 and Comparative Examples 1 to 5

Each photosensitive resin sheet and photosensitive resin printing plate original were prepared in the same manner as in Example 1, except that the constitution of each photosensitive resin composition was changed as shown in Tables 2 and 3. The evaluation results are shown in Tables 4 and 5.

Example 3

Production of Photosensitive Resin Sheet 3

A photosensitive resin sheet 3 was prepared in the same manner as in Example 2.

Production of Photosensitive Resin Printing Plate Original 3

A photosensitive resin printing plate original 3 was prepared in the same manner as in Example 2, except that the cover film (H2) for a CTP plate was used. The properties of the thus obtained photosensitive resin printing plate original for a CTP plate were evaluated by the above-described methods and the results thereof are shown in Table 4. Here, the image reproducibility was evaluated in accordance with the evaluation method for a CTP plate.

Example 10

A mixed solvent (water/ethanol=50/50 (weight ratio)) was coated on the above-described support (E1) having the adhesion-promoting layer (G1). Then, the photosensitive resin sheet 2 was press-adhered, and the resultant was dried at 60° C. for 2.5 hours. Here, the post-drying thickness of the resulting plate (polyester film+photosensitive resin layer) was controlled to be 0.95 mm. On the photosensitive resin layer obtained in this manner, a mixed solvent (water/ethanol=50/50 (weight ratio)) was coated and the above-described cover film (H1) for an analog plate was press-adhered to the surface, thereby a photosensitive resin printing plate original was obtained. The properties of the thus obtained photosensitive resin printing plate original were evaluated by the above-described methods and the results thereof are shown in Table 4. Here, the image reproducibility was evaluated in accordance with the evaluation method for an analog plate.

Example 11

Production of Photosensitive Resin Sheet 11

A photosensitive resin sheet 11 was prepared in the same manner as in Example 2, except that a dye was added.

Production of Photosensitive Resin Printing Plate Original 11

A photosensitive resin printing plate original 11 was prepared in the same manner as in Example 2, except that a dye was added. The properties of the thus obtained photosensitive resin printing plate original were evaluated by the above-described methods and the results thereof are shown in Table 4. Here, the image reproducibility was evaluated in accordance with the evaluation method for an analog plate.

Example 12

Production of Photosensitive Resin Sheet 12

A photosensitive resin sheet 12 was prepared in the same manner as in Example 11.

Production of Photosensitive Resin Printing Plate Original 12

A photosensitive resin printing plate original 12 was prepared in the same manner as in Example 11, except that the cover film (H2) for a CTP plate was used. The properties of the thus obtained photosensitive resin printing plate original for a CTP plate were evaluated by the above-described methods and the results thereof are shown in Table 4. Here, the image reproducibility was evaluated in accordance with the evaluation method for a CTP plate.

Example 13

Production of Photosensitive Resin Sheet 13

A photosensitive resin sheet 13 was prepared in the same manner as in Example 11.

Production of Photosensitive Resin Printing Plate Original 13

The photosensitive resin composition solution obtained above was flow-cast on the above-described support (E2) having the adhesion-promoting layer (G2) and dried at 60° C. for 2.5 hours. Here, the post-drying thickness of the resulting plate (polyester film+photosensitive resin layer) was controlled to be 0.95 mm. On the photosensitive resin layer obtained in this manner, a mixed solvent (water/ethanol=50/50 (weight ratio)) was coated and the above-described cover film (H1) for an analog plate was press-adhered to the surface, thereby a photosensitive resin printing plate original was obtained. The properties of the thus obtained photosensitive resin printing plate original were evaluated by the above-described methods and the results thereof are shown in Table 4. Here the image reproducibility was evaluated in accordance with the evaluation method for an analog plate.

TABLE 2

|  |  |  | 1st | | | | | | |
|---|---|---|---|---|---|---|---|---|---|
|  |  |  | Example 1 | Example 2 | Example 3 | Example 4 | Example 5 | Example 6 | Example 7 |
| Added amount | Component (A) | A1 | 50 | 50 | 50 | 50 | 50 | 50 | 50 |
|  |  | A2 | — | — | — | — | — | — | — |

TABLE 2-continued

| (parts by weight) | | A3 | — | — | — | — | — | — | — |
|---|---|---|---|---|---|---|---|---|---|
| | Component (B) | | 7.5 | 7.5 | 7.5 | 7.5 | 7.5 | 7.5 | 7.5 |
| | Compound having a polymerizable ethylenic double bond | C1 | 5 | 10 | 10 | — | — | — | — |
| | | C2 | — | — | — | 10 | — | — | — |
| | | C3 | — | — | — | — | 10 | — | — |
| | | C4 | — | — | — | — | — | 28 | 10 |
| | | C5 | — | — | — | — | — | — | — |
| | | C'1 | — | — | — | — | — | — | — |
| | | C'2 | — | — | — | — | — | — | — |
| | | C'3 | — | — | — | — | — | — | — |
| | | C'4 | 12 | 7 | 7 | 7 | 7 | — | 7 |
| | | C'5 | — | — | — | — | — | — | — |
| | | C'6 | — | — | — | — | — | — | — |
| | | C'7 | 11 | 11 | 11 | 11 | 11 | — | 11 |
| Photopolymerization initiator | 2,2-dimethoxy-1,1-diphenylethane-1-one | | 1.3 | 1.3 | 1.3 | 1.3 | 1.3 | 1.3 | 1.3 |
| Plasticizer | pentaerythritol polyoxyethylene ether | | 10 | 10 | 10 | 10 | 10 | 10 | 10 |
| Polymerization inhibitor | N-(ammonium oxy)-N-nitrosophenylamine | | 0.2 | 0.2 | 0.2 | 0.2 | 0.2 | 0.2 | 0.2 |
| Ultraviolet absorber | 2,4-di-tert-butyl-6-(5-chloro-2H-1,2,3-benzotriazole-2-yl)phenol | | 0.02 | 0.02 | 0.02 | 0.02 | 0.02 | 0.02 | 0.02 |
| Dye | C.I. Acid Blue 90 | | 0 | 0 | 0 | 0 | 0 | 0 | 0 |
| Substrate | | | E1 | E1 | E1 | E1 | E1 | E1 | E1 |
| Cover fiber | | | for analog plate | for analog plate | for CTP plate | for analog plate | for analog plate | for analog plate | for analog plate |

2nd

| | | | Example 8 | Example 9 | Example 10 | Example 11 | Example 12 | Example 13 |
|---|---|---|---|---|---|---|---|---|
| Added amount (parts by weight) | Component (A) | A1 | — | — | 50 | 50 | 50 | 50 |
| | | A2 | 50 | — | — | — | — | — |
| | | A3 | — | 50 | — | — | — | — |
| | Component (B) | | 7.5 | 7.5 | 7.5 | 7.5 | 7.5 | 7.5 |
| | Compound having a polymerizable ethylenic double bond | C1 | — | — | 10 | 10 | 10 | 10 |
| | | C2 | — | — | — | — | — | — |
| | | C3 | — | — | — | — | — | — |
| | | C4 | — | — | — | — | — | — |
| | | C5 | 28 | 10 | — | — | — | — |
| | | C'1 | — | — | — | — | — | — |
| | | C'2 | — | — | — | — | — | — |
| | | C'3 | — | — | — | — | — | — |
| | | C'4 | — | 7 | 7 | 7 | 7 | 7 |
| | | C'5 | — | — | — | — | — | — |
| | | C'6 | — | — | — | — | — | — |
| | | C'7 | — | 11 | 11 | 11 | 11 | 11 |
| Photopolymerization initiator | 2,2-dimethoxy-1,1-diphenylethane-1-one | | 1.3 | 1.3 | 1.3 | 1.3 | 1.3 | 1.3 |
| Plasticizer | pentaerythritol polyoxyethylene ether | | 10 | 10 | 10 | 10 | 10 | 10 |
| Polymerization inhibitor | N-(ammonium oxy)-N-nitrosophenylamine | | 0.2 | 0.2 | 0.2 | 0.2 | 0.2 | 0.2 |
| Ultraviolet absorber | 2,4-di-tert-butyl-6-(5-chloro-2H-1,2,3-benzotriazole-2-yl)phenol | | 0.02 | 0.02 | 0.02 | 0.02 | 0.02 | 0.02 |
| Dye | C.I. Acid Blue 90 | | 0 | 0 | 0 | 0.02 | 0.02 | 0.02 |
| Substrate | | | E1 | E1 | E1 | E1 | E1 | E2 |
| Cover fiber | | | for analog plate | for analog plate | for analog plate | for analog plate | for CTP plate | for analog plate |

TABLE 3

| | | | Comparative Example 1 | Comparative Example 2 | Comparative Example 3 | Comparative Example 4 | Comparative Example 5 |
|---|---|---|---|---|---|---|---|
| Added amount (parts by weight) | Component (A) | A1 | 50 | 50 | 50 | 50 | 57.5 |
| | | A2 | — | — | — | — | — |
| | | A3 | — | — | — | — | — |
| | Component (B) | | 7.5 | 7.5 | 7.5 | 7.5 | — |
| | Compound having a polymerizable ethylenic double bond | C1 | — | — | — | — | 10 |
| | | C2 | — | — | — | — | — |
| | | C3 | — | — | — | — | — |

TABLE 3-continued

|  |  | Comparative Example 1 | Comparative Example 2 | Comparative Example 3 | Comparative Example 4 | Comparative Example 5 |
|---|---|---|---|---|---|---|
|  | C4 | — | — | — | — | — |
|  | C5 | — | — | — | — | — |
|  | C'1 | — | 10 | — | — | — |
|  | C'2 | — | — | 10 | — | — |
|  | C'3 | — | — | — | 10 | — |
|  | C'4 | 12 | 7 | 7 | 7 | 7 |
|  | C'5 | 4 | — | — | — | — |
|  | C'6 | 1 | — | — | — | — |
|  | C'7 | 11 | 11 | 11 | 11 | 11 |
| Photopolymerization initiator | 2,2-dimethoxy-1,1-diphenylethane-1-one | 1.3 | 1.3 | 1.3 | 1.3 | 1.3 |
| Plasticizer | pentaerythritol polyoxyethylene ether | 10 | 10 | 10 | 10 | 10 |
| Polymerization inhibitor | N-(ammonium oxy)-N-nitrosophenylamine | 0.2 | 0.2 | 0.2 | 0.2 | 0.2 |
| Ultraviolet absorber | 2,4-di-tert-butyl-6-(5-chloro-2H-1,2,3-benzotriazole-2-yl)phenol | 0.02 | 0.02 | 0.02 | 0.02 | 0.02 |

TABLE 4

| 1st | | Example 1 | Example 2 | Example 3 | Example 4 | Example 5 | Example 6 | Example 7 |
|---|---|---|---|---|---|---|---|---|
| Elongation at Break/% | | 285 | 358 | 358 | 325 | 399 | 1084 | 377 |
| Image reproducibility | Half-tone (score) | 5 | 5 | 5 | 3 | 5 | 2 | 5 |
|  | Dot (number of reproduced dots) | 3 | 3 | 3 | 1 | 3 | 1 | 3 |
| Relief crack (Number of printing plates with relief crack) | 50,000 rotations | 0 | 0 | 0 | 0 | 0 | 0 | 0 |
|  | 100,000 rotations | 0 | 0 | 0 | 0 | 0 | 0 | 0 |
|  | 150,000 rotations | 1 | 0 | 0 | 0 | 0 | 0 | 0 |
|  | 200,000 rotations | 2 | 0 | 0 | 0 | 0 | 0 | 0 |
| ΔE * ab | | — | 1.5 | — | — | — | — | — |

| 2nd | | Example 8 | Example 9 | Example 10 | Example 11 | Example 12 | Example 13 |
|---|---|---|---|---|---|---|---|
| Elongation at Break/% | | 413 | 305 | 358 | 358 | 358 | 358 |
| Image reproducibility | Half-tone (score) | 2 | 5 | 5 | 5 | 5 | 5 |
|  | Dot (number of reproduced dots) | 2 | 3 | 3 | 3 | 3 | 3 |
| Relief crack (Number of printing plates with relief crack) | 50,000 rotations | 0 | 0 | 0 | 0 | 0 | 0 |
|  | 100,000 rotations | 0 | 0 | 0 | 0 | 0 | 0 |
|  | 150,000 rotations | 0 | 0 | 0 | 0 | 0 | 0 |
|  | 200,000 rotations | 0 | 0 | 0 | 0 | 0 | 0 |
| ΔE * ab | | — | — | — | 12 | 12 | 20 |

TABLE 5

| | | Comparative Example 1 | Comparative Example 2 | Comparative Example 3 | Comparative Example 4 | Comparative Example 5 |
|---|---|---|---|---|---|---|
| Elongation at Break/% | | 125 | 312 | 277 | 212 | 225 |
| Image reproducibility | Half-tone (score) | 5 | 2 | 3 | 3 | 5 |
|  | Dot (number of reproduced dots) | 3 | 0 | 1 | 0 | 3 |
| Relief crack (Number of printing plates with relief crack) | 50,000 rotations | 1 | 0 | 0 | 0 | 0 |
|  | 100,000 rotations | 4 | 0 | 0 | 1 | 1 |
|  | 150,000 rotations | 5 | 0 | 1 | 2 | 1 |
|  | 200,000 rotations | 5 | 0 | 2 | 3 | 3 |

The invention claimed is:

1. A photosensitive resin composition comprising:
(A) a modified and partially saponified polyvinyl acetate having a reactive group in a side chain;
(B) a basic nitrogen-containing polyamide;
(C) a heterocyclic compound having a molecular weight of 300 or less, which comprises a heterocyclic 5 to 7-membered ring and a polymerizable ethylenic double bond; and
(D) a photopolymerization initiator.

2. The photosensitive resin composition according to claim 1, wherein said (C) compound is a compound further including an additional functional group which is a member selected from the group consisting of a hydroxyl group, a carboxyl group and an amino group.

3. The photosensitive resin composition according to claim 1, wherein said (A) modified and partially saponified polyvinyl acetate having a reactive group in a side chain is a modified and partially saponified polyvinyl acetate in which said reactive group is introduced by allowing a partially saponified polyvinyl acetate to react with an acid anhydride so as to introduce a carboxyl group into a polymer side chain and subsequently allowing said carboxyl group to react with an unsaturated epoxy compound.

4. The photosensitive resin composition according to a claim 1, wherein said (A) modified and partially saponified polyvinyl acetate having a reactive group in a side chain is a modified and partially saponified polyvinyl acetate which is obtained by adding an unsaturated epoxy compound to an anion-modified polyvinyl alcohol having a saponification degree of 60 to 90% by mol obtained by saponification of a copolymer of vinyl acetate and an unsaturated carboxylic acid, a salt thereof or an unsaturated carboxylic acid ester.

5. The photosensitive resin composition according to claim 1, wherein said (A) modified and partially saponified polyvinyl acetate having a reactive group in a side chain is a modified and partially saponified polyvinyl acetate obtained by a reaction between a partially saponified polyvinyl acetate and an acrylic compound having an N-methylol group.

6. The photosensitive resin composition according to claim 1, wherein said (B) basic nitrogen-containing polyamide comprises a piperazine ring.

7. The photosensitive resin composition according to claim 1, further comprising a water-soluble triphenylmethane-based dye.

8. A photosensitive resin printing plate original, comprising a photosensitive resin layer formed on a support using the photosensitive resin composition according to claim 1.

9. A photosensitive resin printing plate original, comprising a photosensitive resin layer formed on a support using the photosensitive resin composition according to claim 2.

10. A photosensitive resin printing plate original, comprising a photosensitive resin layer formed on a support using the photosensitive resin composition according to claim 3.

11. A photosensitive resin printing plate original, comprising a photosensitive resin layer formed on a support using the photosensitive resin composition according to claim 4.

12. A photosensitive resin printing plate original, comprising a photosensitive resin layer formed on a support using the photosensitive resin composition according to claim 5.

13. A photosensitive resin printing plate original, comprising a photosensitive resin layer formed on a support using the photosensitive resin composition according to claim 6.

14. A photosensitive resin printing plate original, comprising a photosensitive resin layer formed on a support using the photosensitive resin composition according to claim 7.

15. A method of producing a resin printing plate which comprises:

partially exposing a photosensitive resin layer formed from the photosensitive resin composition according to claim 1 to ultraviolet light; and forming a relief layer by removing non-exposed portion of said photosensitive resin layer by development using a developer solution containing water as a main component.

16. The photosensitive resin composition according to claim 1, wherein said (A) modified and partially saponified polyvinyl acetate having a reactive group in a side chain comprises at least the following structural units (I), (II) and (III):

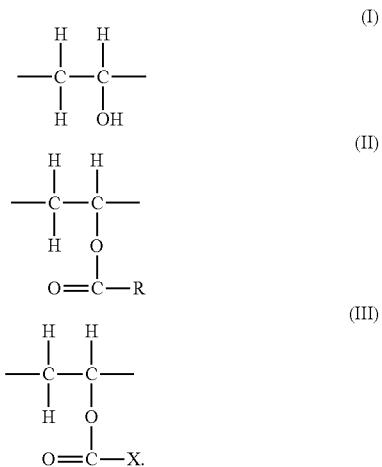

17. The photosensitive resin composition according to claim 1, wherein said (C) compound is contained in an amount of 5 to 200 parts by weight with respect to 100 parts by weight of component (A) modified and partially saponified polyvinyl acetate having a reactive group in a side chain.

* * * * *